United States Patent
Lee (10) Patent No.: US 12,119,799 B1
(45) Date of Patent: Oct. 15, 2024

(54) HARMONIC SUPPRESSED BANDWIDTH AND CENTER FREQUENCY TUNABLE CAPACITIVE COUPLED BAND PASS FILTER

(71) Applicant: HRL Laboratories, LLC, Malibu, CA (US)

(72) Inventor: Hanseung Lee, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 461 days.

(21) Appl. No.: 17/523,300

(22) Filed: Nov. 10, 2021

Related U.S. Application Data (60) Provisional application No. 63/167,549, filed on Mar. 29, 2021.

(51) Int. Cl.
| | | |
|---|---|---|
| H03H 7/01 | (2006.01) | |
| H01P 1/203 | (2006.01) | |
| H03H 7/18 | (2006.01) | |
| H03H 7/34 | (2006.01) | |

(52) U.S. Cl.
CPC ........ *H03H 7/0115* (2013.01); *H03H 7/0153* (2013.01); *H03H 7/18* (2013.01); *H03H 7/345* (2013.01)

(58) Field of Classification Search
CPC ...... H03H 7/345; H03H 7/185; H03H 7/0123; H01P 1/203
USPC .......................... 333/138, 139, 174, 204, 205
See application file for complete search history.

(56) References Cited

U.S. PATENT DOCUMENTS

2011/0248793 A1* 10/2011 Kim ...................... H01P 1/2135
333/204

OTHER PUBLICATIONS

S. B. Cohn, "Parallel-coupled transmission-line-resonator filters", IRE Transactions on Microwave Theory and Techniques, 1958, pp. 223-231.
C. Lugo, D. Thompson, J. Papapolymerou, "Reconfigurable bandpass filter with variable bandwidth at 5.8 GHz using a capacitive gap variation technique", 2003 European Microwave Conference, 2003, pp. 923-926.

* cited by examiner

*Primary Examiner* — Rakesh B Patel
(74) *Attorney, Agent, or Firm* — Ladas & Parry, LLP (57) ABSTRACT

A filter comprising a linear array of a plurality of TL-inspired T-networks connected in series by capacitors, each TL-inspired T-network typically comprising a pair of conventional transmission lines connected in series with a circuit comprising pair of inductors and a single capacitor, the conventional transmission lines associated with each TL-inspired T-network being optionally combinable together or with conventional transmission lines in neighboring TL-inspired T-networks, wherein the circuit comprising a pair of inductors and a single capacitor is an artificial transmission line providing target characteristic impedance, which is same as that of the conventional transmission lines, and phase delay.

16 Claims, 7 Drawing Sheets

Fig. 2b-1 TL inspired T-network example (60° at 3GHZ)

Fig. 2b-2 TL inspired T-network tunability

HARMONIC SUPPRESSED BANDWIDTH AND CENTER FREQUENCY TUNABLE CAPACITIVE COUPLED BAND PASS FILTER

CROSS REFERENCE TO RELATED APPLICATIONS

This application claims the benefit of U.S. Provisional Patent Application Ser. No. 63/167,549 filed 29 Mar. 2021 and also entitled "Harmonic Suppressed Bandwidth and Center Frequency Tunable Capacitive Coupled Band Pass Filter", the disclosure of which is hereby incorporated herein by reference.

STATEMENT REGARDING FEDERALLY SPONSORED RESEARCH OR DEVELOPMENT

None.

TECHNICAL FIELD

This document describes the geometry and characteristics of a harmonic suppressed bandwidth and center frequency tunable band pass filter.

BACKGROUND

A high-power microwave directed-energy weapon can destroy electronics. The proposed tunable filter can be used to prevent such attacks by controlling the received signal's frequency and bandwidth. The concepts disclosed herein can be also beneficial to wireless communication companies. Nowadays, various wireless systems including cellular, GNSS, WiFi, and V2X should be installed in platforms like vehicles and hand-held units and filters are essential for selecting desirable target signals. With limited space and cost restraints, using many filters for handling each frequency band is not a practical approach. Therefore, a highly tunable filter can be a good solution for overcoming this issue. And, more particularly, a filter where harmonics are suppressed is quite desirable.

Figure 7:
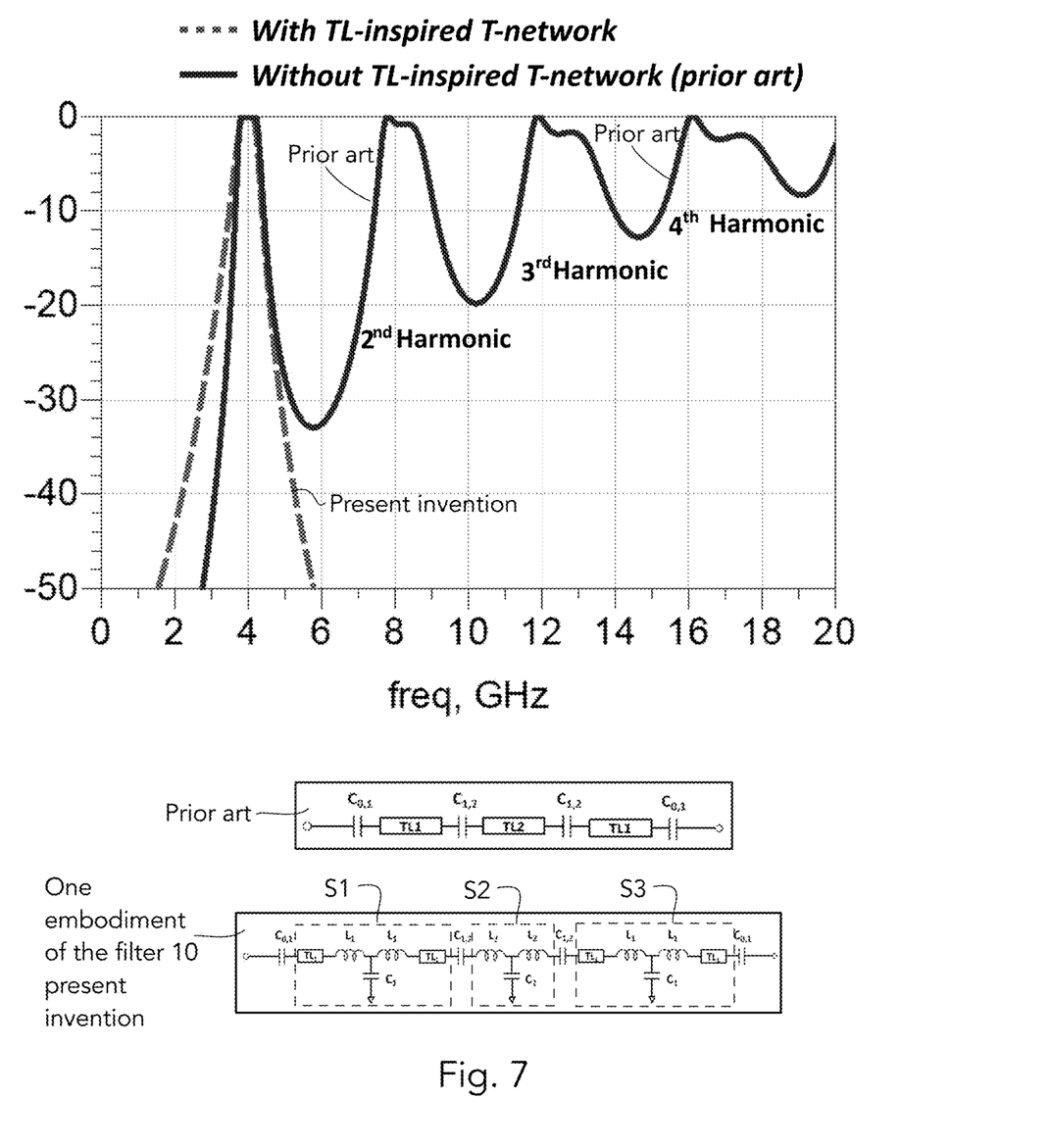
FIG. 7 depicts a prior art distributed capacitive coupled band pass filter and its response pattern (with a solid line) compared with an embodiment of the band pass filter response of the present invention and its response pattern (with a dashed line).

FIG. 7 shows both a prior art approach to this issue (in a solid line on the graph) as well as an embodiment of the filter 10 of the present invention (whose response is shown in a dashed line on the graph). FIG. 7 includes a schematic diagram of a prior art distributed capacitive coupled band pass filter and a graph (in the aforementioned solid line) of its filtering capabilities which includes undesirable harmonics. The prior art response pattern can be compared with the filtering capabilities of an embodiment of the present inventive filter 10, also depicted in FIG. 7, which is substantially free of such undesirable harmonics.

In the prior art circuit of FIG. 7, three transmission lines (TLs) TL1, TL2 and TL1 are connected in series by capacitors $C_{0,1}$, $C_{1,2}$, $C_{,1,2}$, $C_{0,1}$ as shown. The two transmission lines labeled TL1 are identical (they have the same transmission characteristics) to each other, and the two capacitors labeled $C_{0,1}$ and identical to each other (they have the same capacitance). The two capacitors labeled $C_{1,2}$ are also identical to each other (they also have the same capacitance) and, as such, the prior art filter of FIG. 7 has the same input and output impedances. The prior art filter of FIG. 7 would typically have some nominal, desired or target center frequency and bandwidth and could be used, for example, to connect a transmitter and/or a receiver to an antenna (or an antenna array). The filter circuit 10 of the present invention shown by FIG. 7 is discussed in greater detail below.

BRIEF DESCRIPTION OF THE INVENTION

In one aspect the present invention provides a filter comprising a linear array of a plurality of TL-inspired T-networks connected in series by capacitors, each TL-inspired T-network typically comprising a pair of conventional transmission lines connected in series with a circuit comprising a pair of inductors and a single capacitor, wherein the circuit comprising a pair of inductors and a single capacitor is an artificial transmission line providing a target characteristic impedance, which is same as a target characteristic impedance of the conventional transmission lines, and phase delay.

In another aspect the present invention provides a filter comprising a plurality of TL-inspired T-networks, the plurality of TL-inspired T-networks being connected in series by capacitors, the plurality of TL-inspired T-networks each comprising a pair of conventional transmission lines connected in series with a network of reactance devices.

In still yet another aspect the present invention provides a method of designing and/or making a harmonic suppressed bandwidth and center frequency tunable capacitive coupled band pass filter comprising: selecting a prior art filter design to be converted to the harmonic suppressed bandwidth and center frequency tunable capacitive coupled band pass filter, the prior art filter design comprising a series of conventional transmission lines connected in series with capacitors; replacing one or more of the conventional transmission lines with a pair of conventional transmission lines each having less than one-half the phase delay of the at least one of the conventional transmission lines being replaced, and inserting a lumped circuit of reactance devices between the pair of conventional transmission lines each having less than one-half the phase delay of the conventional transmission line or lines being replaced.

In yet another aspect the present invention provides an improved transmission line that inhibits the transmission of harmonics compared to a conventional transmission line, the improved transmission line comprising: a pair of relatively short conventional transmission lines, each relatively short conventional transmission line being shorter than said conventional transmission line and each having less than one-half the phase delay of said conventional transmission line, and a lumped circuit of reactance devices inserted between the pair of relatively short conventional transmission lines, the lumped circuit having a lumped circuit phase delay and wherein the lumped circuit phase delay plus a total phase delay of the pair of relatively short conventional transmission lines substantially equals the phase delay of said conventional transmission line.

BRIEF DESCRIPTION OF THE DRAWINGS

FIG. 2b-1 is a graph of phase delay vs frequency of a TL inspired T-network compared with a conventional TL and FIG. 2b-2 is a graph of tunability of a TL inspired T-network.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

As mentioned above, FIG. 7 shows a circuit diagram of an embodiment of the filter of the present invention as well as its harmonic suppression characteristic. The circuit diagram of an embodiment of the filter of the present invention comprises three segments S1, S2 and S3. In this embodiment the first segment S1 and the third segment S3 are identical to each other as the input and output impedances of the inventive filter of FIG. 7 are the same. If S1 were different from S3 then the input and output impedances may also be different and the filter could then also be used as an impedance match between, for example, a transmitter and/or a receiver to an antenna (or an antenna array) in addition to its use as a harmonic-suppressed filter. The filter of the present invention has highly tunable characteristic with tunable segments S1, S2, and S3 as well as $C_{0,1}$ and $C_{1,2}$.

Each segment is called a Transmission Line-inspired T-network (TL-inspired T-network) herein and each TL-inspired T-network typically includes a pair of inductors, a capacitor as well as a pair of transmission lines. Sometimes the transmission lines are omitted from a segment (such as segment S2 in FIG. 7) which can be thought of, from an analytical viewpoint, as including transmission lines having zero phase delay.

The reader should now turn to FIGS. 1, 2a, 2b-1, 2b-2, 2c and 3.

Figure 1:
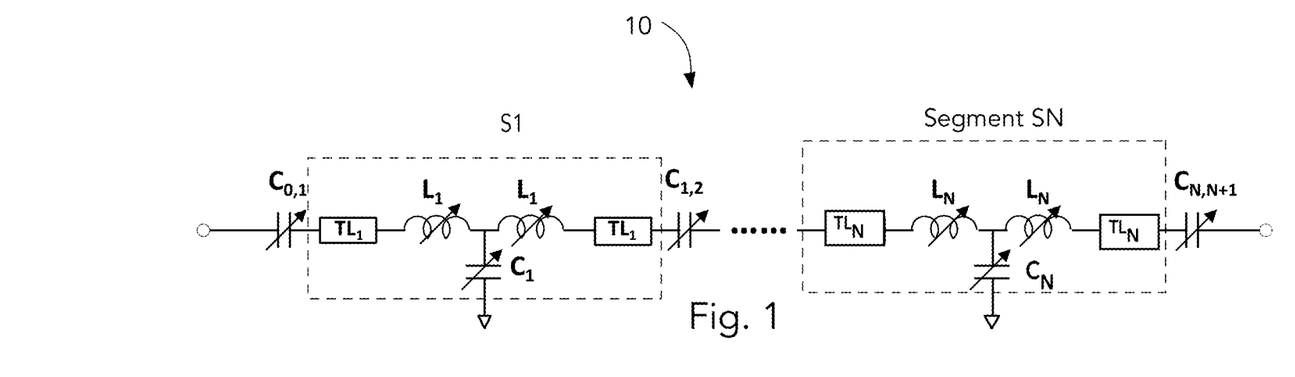
FIG. 1 is a circuit diagram of the proposed tunable filter.

An embodiment of the tunable filter of the present invention is shown in the circuit diagram of FIG. 1. It comprises series-connected capacitors ($C_{0,1}$, $C_{1,2}$, ..., $C_{N,N+1}$) connected in series with tunable TL-inspired T-networks in segments S1 and SN. Each segment is called a TL-inspired T-network herein. The series-connected capacitors between segments (TL-inspired T-networks) are preferably tunable. Only a first segment S1 and a $n^{th}$ segment SN are shown in detail, it being understood that the embodiment of FIG. 1 may comprises numerous segments (each comprising a TL-inspired T-network) and, as will be described, that each segment need not necessarily include its own transmission lines. The number of segments (N) is dependent on a system requirement. Sharper skirt performance of the filter requires a larger number (N) of segments. The tunable TL-inspired T-network preferably consists of no or two conventional TLs (whose phase delay is less than the aforementioned target or desired phase delay of the TL-inspired T-network) and tunable circuit components comprising reactive components, $C_N$ and $L_N$. A tunable TL-inspired T-network consisting of a single conventional TL plus tunable reactive components is a less desirable option. A conventional (distributed) transmission line preferably takes the form of a microstrip line and/or a coplanar waveguide (CPW) but other structures including coax, waveguides, substrate integrated waveguides (SIW) can be used. Since the lumped circuit made with $C_N$ and $L_N$ has intrinsically a low pass characteristic, the TL-inspired T-network of each segment can provide harmonic suppression capability.

Figure 3:
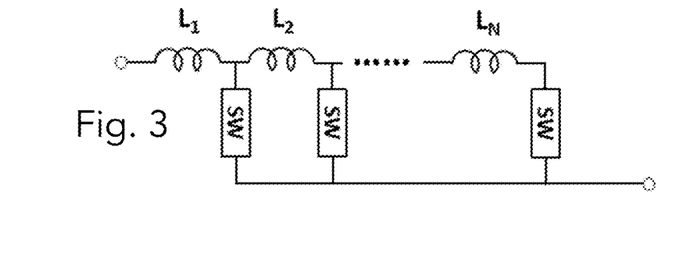
FIG. 3 is a circuit diagram an embodiment of the proposed tunable inductor.

In FIG. 1 the reactive devices are depicted as being tunable so that the filter 10 of FIG. 1 is similarly tunable. The filter 10 of FIG. 1 may be embodied as a non-tunable filter with fixed reactance devices if desired. An embodiment of a tunable inductor is shown in FIG. 3, which is described in greater detail below.

Figure 2A:
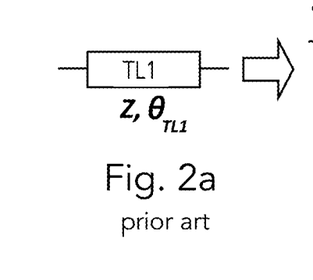
FIG. 2a depicts a transmission line (TL) segment of a conventional distributed capacitive coupled band pass filter.
Figure 2B:
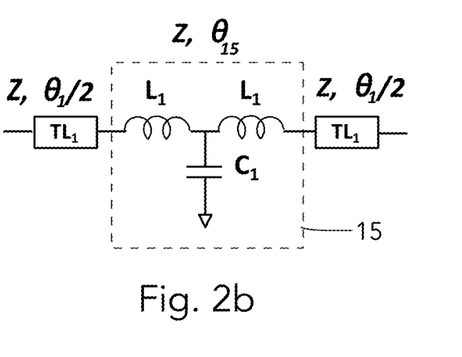
FIG. 2b shows a segment (TL inspired T-network) of a filter in accordance with the present invention which may replace the segment of FIG. 2a to reduce the harmonics of the filter and to provide tunability.
Figure 2B:
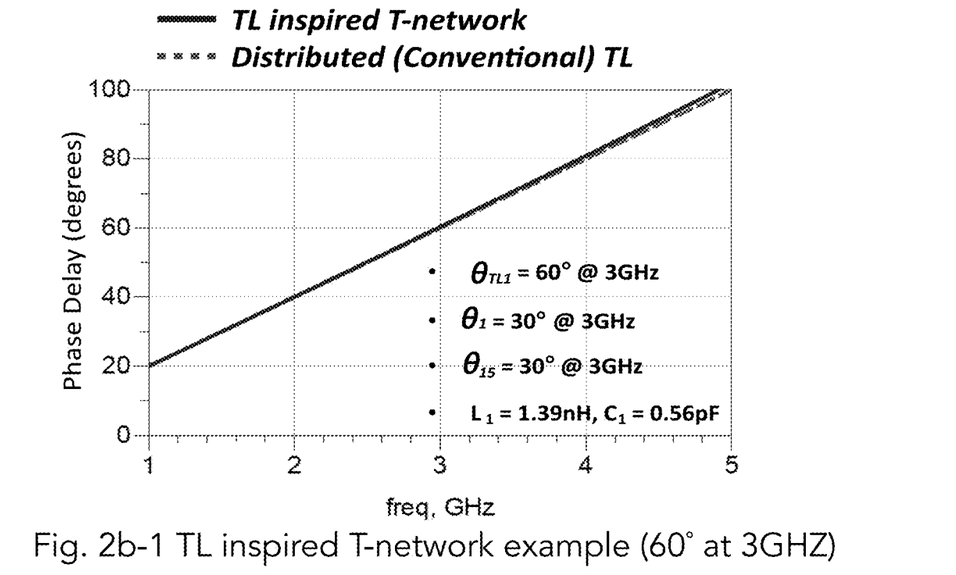
Figure 2B:
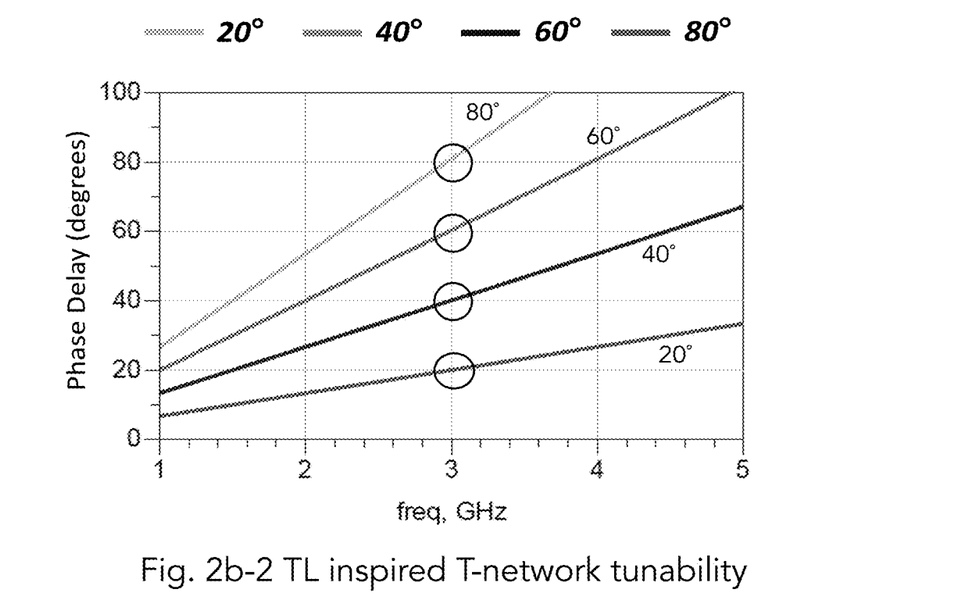

FIG. 2a depicts one of the transmission line segments in the prior art filter of FIG. 7 (TL1 is depicted). TL2 of FIG. 7 would look like FIG. 2a with suitable adjustment of the subscripts. In accordance with an embodiment of the present invention, the transmission lines of the prior art filter of FIG. 7 (such as TL1 shown in FIG. 2a) are each replaced with the TL-inspired T-network of FIG. 2b which consists of two conventional transmission lines TL1, two inductors $L_1$, and a capacitor $C_1$. TL1 of FIG. 2a has a phase delay of $\theta_{TL1}$ and an impedance Z. The two $TL_1$ of FIG. 2b each have less phase delay than $\theta_{TL1}$, each of which has a phase delay preferably equal to $\theta_1/2$ and each of which preferably has an impedance Z. $\theta_{15}$ is the phase delay of the lumped circuit combination 15 of inductors $L_1$ and capacitor $C_1$ of FIG. 2b. Numerical and component relationships are presented in the below:

$$\theta_{TL1} = \theta_1 \downarrow_{15} \quad \text{(Equation 1);}$$

$$Z_0 = \sqrt{\left(\frac{2L1}{C1}\right)}; \quad \text{(Equation 2)}$$

$$\theta_{15} = \omega 0\sqrt{(2L1)C1}. \quad \text{(Equation 3)}$$

where $\omega_0$, is angular center frequency and Z is the impedance of the transmission line being replaced by the circuits of FIG. 1 or 2b, for example.

$\theta_{TL1}$ is the desired phase delay of the TL1 of FIG. 2a as well as the desired overall phase delay of the circuit of FIG. 2b. That phase delay is obtained by adding the phase delays of the two TL1 ($\theta_1 = \theta_1/2.2$) plus the phase delay $\theta_{15}$ of the lumped circuit combination 15 of inductors L1 and capacitor C1. FIG. 2b shows one example of the tuned circuit 15. FIG. 2b-l is a graph of phase delay vs frequency of a TL inspired T-network compared with a conventional TL. A conventional transmission line has 60° phase delay at 3 GHz as well as having 50 ohm characteristic impedance. By using the numerical equation 1 to equation 3 above, the TL-inspired T-network is designed to have the same characteristic phase delay as a conventional, target TL. So, with θ1 of 30° at 3 GHZ, $L_1$ and $C_1$ are calculated to be 0.70 nH and 0.56 pF, respectively. The phase delay of the target conventional TL compares favorably with the TL-inspired T-network using the calculated values of $L_1$ and $C_1$ just set forth. Lumped components $L_1$ and $C_1$ enables a TL-inspired T-network segment having phase delay tunability. Meanwhile, a phase delay of a conventional (distributed) TL cannot be tuned thereby limiting tunability of a filter using the conventional TL. FIG. 2b-2 shows an example depicting tunability of a TL-inspired T-network. By tuning $L_1$ and $C_1$, phase delays from 20° to 80° may be obtained. It should be appreciated, however, that once a filter topology is selected (by selecting a value of N), center frequency and bandwidth of the filter can be selected or tuned. After a center frequency and a bandwidth are selected, the total phase delay of the selected filter structure is fixed.

FIG. 2b-2 shows the tunability of the phase delay of the filter segment (TL-inspired T-network), rather than the whole filter structure. As noted above, with a given filter topology, one can tune center frequency and bandwidth of the filter. Because we can tune the phase delay of a filter segment, we can tune the center frequency and the bandwidth of the whole filter. Phase tunability of the whole filter structure is not an object of this disclosure but it can be simply realized by adding one more TL-inspired T-network.

Figure 2C:
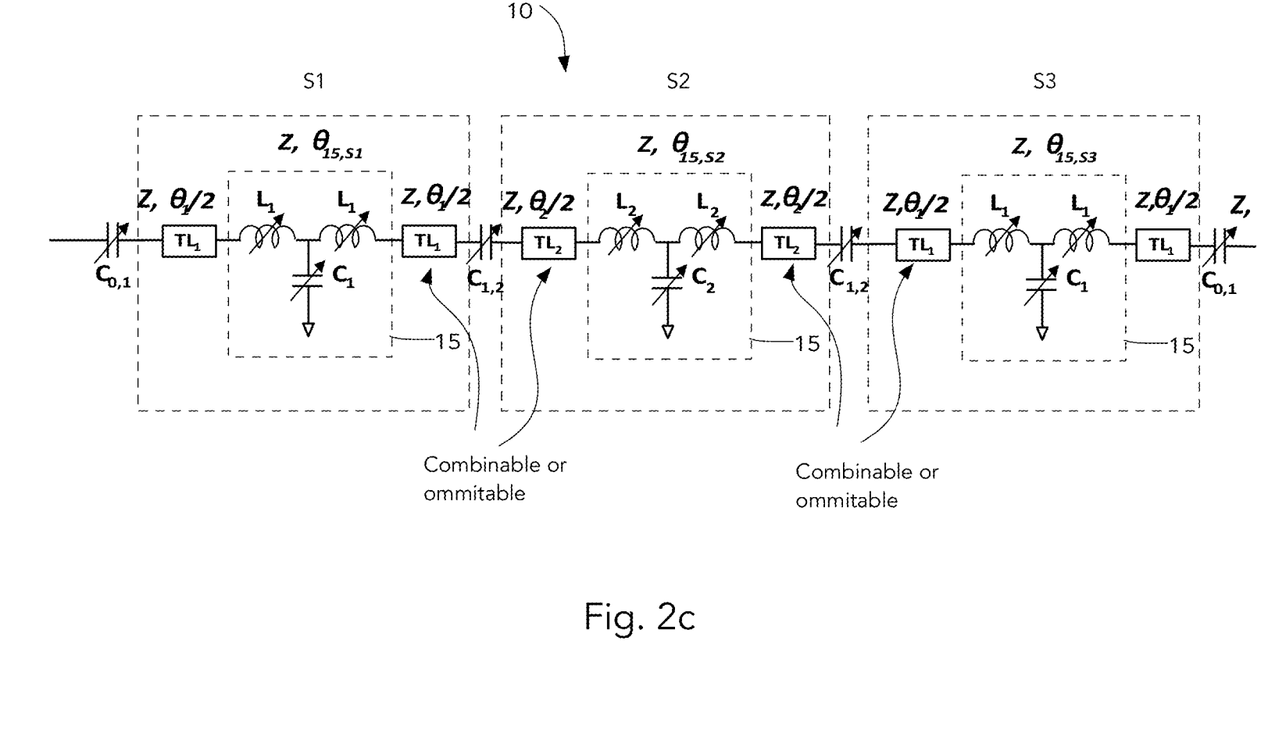
FIG. 2c depicts an embodiment of a Harmonic Suppressed Bandwidth and Center Frequency Tunable Capacitive Coupled Band Pass Filter having capacitively coupled segments.

FIG. 2c shows the results of replacing the three TLs (TL1, TL2 and TL1) of the prior art filter of FIG. 7 with three circuits like that of FIG. 2b, but with subscripts of the various devices and the associated phase delays adjusted accordingly, so the resulting filter has three segments S1, S2 and S3. S1 and S3 are identical in this embodiment since the input and output impedances Z are the same (as will often be the case). If the filter of FIG. 2c were to be also used for impedance matching, for example, then at least the impedance of segments S1 and S3 would change accordingly. The reactive devices of FIG. 2b may be all tunable as shown or all or some may be fixed, as desired. The phase delays $\theta_{15,S1}$, $\theta_{15,S2}$ and $\theta_{15,S3}$ of the circuit combinations 15 need not be the same in each segment. And while three segments are depicted in FIG. 2c, that circuit may be modified to comprise N segments as depicted by FIG. 1.

The tunable capacitors of FIGS. 1 and 2c are preferably embodied by tunable Barium Strontium Titanate (BST) capacitors due to their high quality factors ($Q_S$) and high tunability. As well as a BST capacitor, any electronically controlled capacitor including varactor diodes can be also used. Fixed capacitors may also be used in some embodiments. The transmission lines $TL_1$ $TL_2$ .... $TL_N$ of FIGS. 1, 2b and 2c are preferably embodied as microstrip lines but other transmission lines including coplanar waveguides (CPW) and other waveguides or even coaxial cables may be used if desired.

The inductors $L_1$, $L_2$, and $L_N$ of FIGS. 1 and 2c are preferably tunable and a preferred tunable inductor design is shown in FIG. 3. It is composed with discrete inductor arrays and switches. By controlling the switches (no more than one of which would be closed at any given time), target inductance can be adjusted. The preferred switch is a phase change material (PCM) switch due to its low loss, fewer parasitics, and fast switching time. PCM switches are known in the prior art. Alternatively, a two state (On/Off) device including PIN diodes, FET switches, MEMS switches, or other switches may be used.

The tuning range of inductors $L_1$, $L_2$, and $L_N$ of FIGS. 1 and 2c can be determined as is now described. Depending upon a desired filter specification (center frequency and bandwidth tuning range), the required inductance range is determined. For example, the inductor $L_1$ needs a tuning range of 4 nH to 0.5 nH for a center frequency tuning range of 2.3 GHz to 17.5 GHz.

In the embodiment of FIG. 2c, the three segments S1, S2 and S3 have at total of six distributed transmission lines, two distributed transmission lines being associated with each segment.

Figure 4:
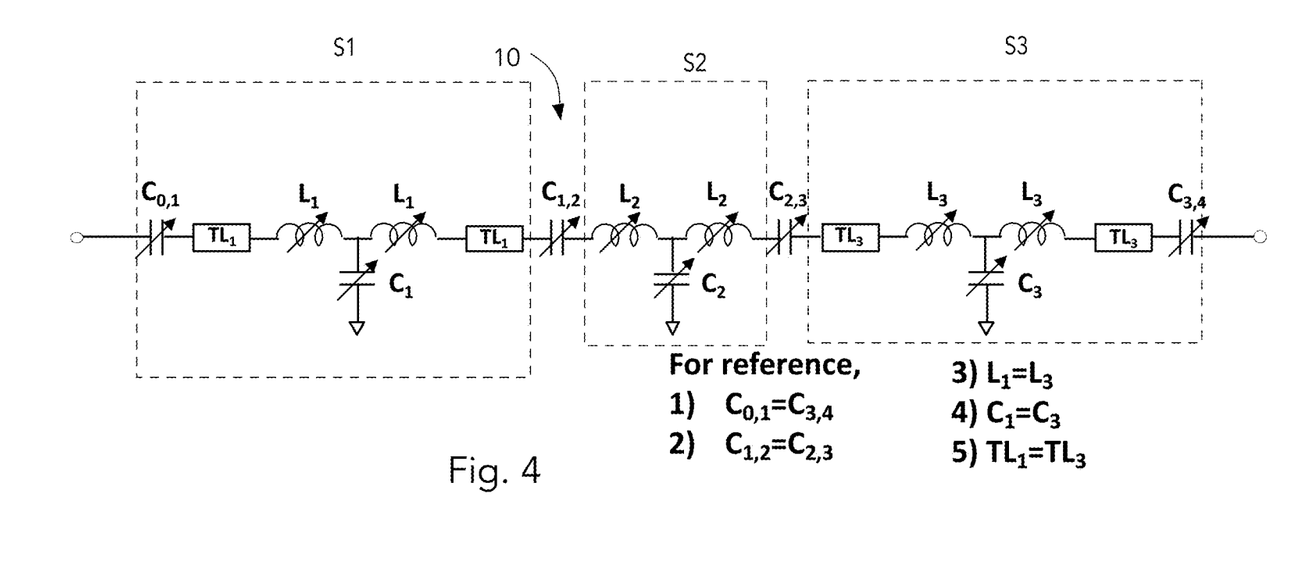
FIG. 4 is circuit diagram of an embodiment of the N=3 tunable filter.

Turning now to FIG. 4, FIG. 4 shows an embodiment where transmission lines are omitted (from segment S2 in this case making is a transmission line free or TL-free segment) compared to the embodiment of FIG. 2c. The phase delay simplified filter embodiment of FIG. 4 would still have an overall phase preferably equal to the target phase delay mentioned above, it being recognized that depending on how the filter 10 is utilized, its overall phase delay can be of critical importance (for example, when used with or in a phased array antenna or in radar applications) but may be of less importance in other applications (such as broadcasting using a single antenna). The filter 10 may be used in other applications not involving antennas and/or transmitters and/or receivers. As noted above, if the phase delay of filter (which is set by the filter design and its center frequency and bandwidth), needs to be changed, that can be accomplished by adding another TL-inspired T-network to the previously selected filter design.

To verify the high tunability of the proposed filter, an embodiment of the filter of FIG. 1 (where it has three segments so N (from FIG. 1) equals three) is shown in FIG. 4 which shows a circuit diagram of a filter 10 in accordance an embodiment of the present invention which has one segment, S2 in this embodiment, which is TL-free. The circuit arrangement of FIG. 4 also appears as the inventive filter circuit arrangement of FIG. 7. Its center frequency tunability and bandwidth tunability are verified by simulations and simulated results are presented in FIGS. 5 and 6, respectively, for the circuit values shown in Table 1 below. The conventional TL sections (when embodied as microstrip lines) used in segments S1 and S3 in the simulation have a 50 ohm characteristic impedance (Z) and 15° phase delay at their center frequency. The width and length of the microstrip lines are dependent on a substrate dielectric constant and thickness used with the microstrip lines. The substrate would typically be a commercially available printed circuit board (PCB) material.

TABLE 1

| Cap: pF<br>Ind: nH | $C_{0,1}$ | $C_{1,2}$ | $C_1$ | $C_2$ | $L_1$ | $L_2$ |
|---|---|---|---|---|---|---|
| 2.3 GHz | 1.6 | 0.7 | 3.2 | 3.9 | 4.0 | 4.9 |
| 4.7 GHz | 0.8 | 0.3 | 1.6 | 2.0 | 2.0 | 2.4 |
| 7 GHz | 0.5 | 0.2 | 1.1 | 1.3 | 1.3 | 1.6 |
| 9.3 GHz | 0.4 | 0.2 | 0.8 | 1.0 | 1.0 | 1.2 |
| 12.8 GHz | 0.3 | 0.1 | 0.6 | 0.7 | 0.7 | 0.9 |
| 15.1 GHz | 0.2 | 0.1 | 0.5 | 0.6 | 0.6 | 0.8 |
| 17.5 GHz | 0.2 | 0.1 | 0.4 | 0.5 | 0.5 | 0.7 |

Figure 5:
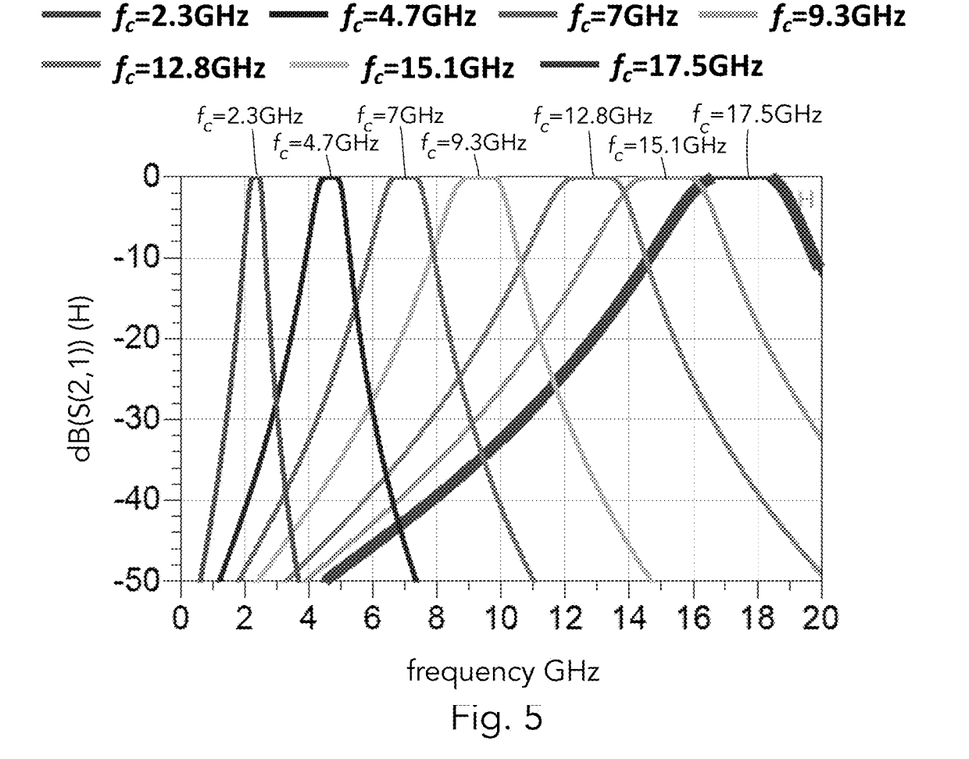
FIG. 5 is a graph depicting the frequency tunability of an embodiment of a Harmonic Suppressed Bandwidth and Center Frequency Tunable Capacitive Coupled Band Pass Filter.
Figure 6:
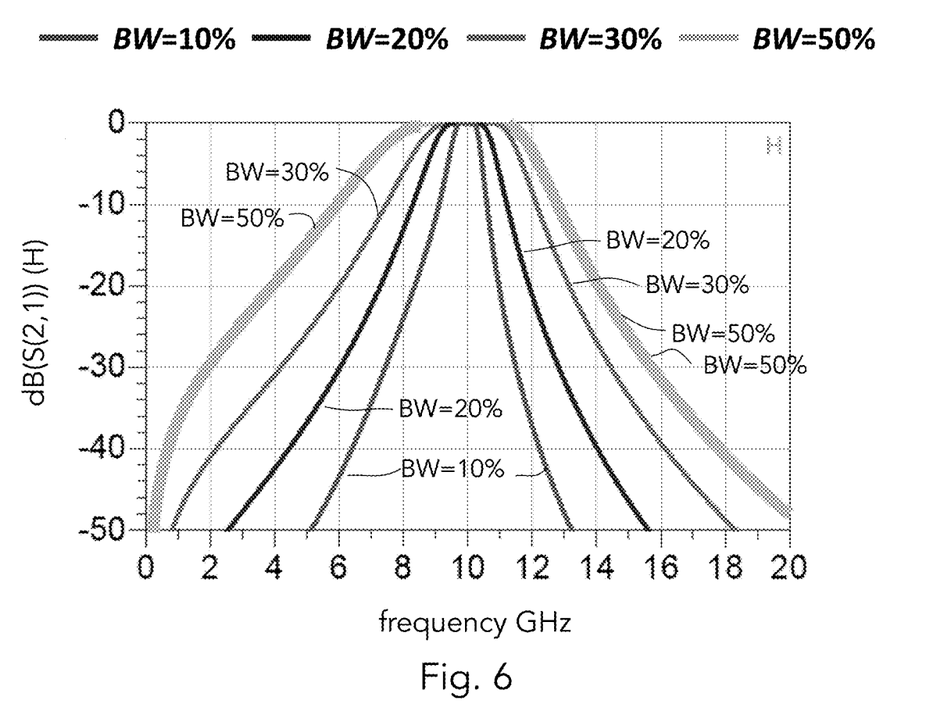
FIG. 6. is a graph depicting the bandwidth tunability of an embodiment of a Harmonic Suppressed Bandwidth and Center Frequency Tunable Capacitive Coupled Band Pass Filter.

FIG. 5 shows frequency tunability of this embodiment of the filter by tuning its capacitors and inductors. In this particular simulation, the filter shows 1:8 frequency tuning ratio (2.3 GHz to 17.5 GHz). However, general frequency tuning ratio is not limited by 1:8 in the proposed approach. The bandwidth tunability of the filter is shown in FIG. 6. This simulation shows the fractional bandwidth from 10% to 50%. However, general bandwidth tuning ratio is not limited to 1:5 in this approach.

FIG. 7 includes a graph (with a dashed line) showing the frequency response of an embodiment of a distributed capacitive coupled band pass filter 10 of the present invention (with fixed values of capacitance and inductance of its components) compared to a N=3 embodiment of the prior art filter (shown with a solid line). Since there are no TL-inspired T-networks in the distributed capacitive coupled prior art band pass filter, harmonics are generated. This limits both frequency and bandwidth tunability. Those harmonics are suppressed by more than 50 dB according to the N=3 embodiment of the band pass filter 10 of FIG. 4 disclosed herein.

FIG. 7 also shows the circuitry of the prior art filter and the circuitry of an embodiment of the present invention.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . . "

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A filter having a tunable center frequency and tunable bandwidth capability, the filter comprising a linear array of a plurality of TL-inspired T-networks connected in series by tunable capacitors, each TL-inspired T-network comprising a pair of conventional transmission lines connected in series with a circuit comprising a pair of inductors and a single capacitor, wherein the circuit comprising a pair of inductors and a single capacitor simulates an artificial transmission line providing a target characteristic impedance and a tunable phase delay.

2. A filter comprising a plurality of TL-inspired T-networks, the plurality of TL-inspired T-networks being connected in series by tunable capacitors, the plurality of TL-inspired T-networks each comprising a pair of conventional transmission lines connected in series with a network of reactance devices.

3. The filter of claim 2 wherein the filter further includes (i) a capacitor connected between an input of the filter and the plurality of TL-inspired T-networks and (ii) another capacitor connected between an output of the filter and the plurality of TL-inspired T-networks.

4. The filter of claim 3 wherein the network of reactance devices of each of the TL-inspired T-networks is connected in series between the pair of conventional transmission lines.

5. The filter of claim 2 wherein the network of reactance devices of each of the TL-inspired T-networks is connected in series between the pair of conventional transmission lines.

6. The filter of claim 2 wherein the network of reactance devices of each of the TL-inspired T-networks comprises a pair of inductors and a capacitor.

7. The filter of claim 6 wherein the pair of inductors and the capacitor of the network of reactance devices of each of the TL-inspired T-networks are tunable.

8. The filter of claim 2 further including at one least one TL-free network connected by additional tunable capacitors in series with the plurality of TL-inspired T-networks.

9. The filter of claim 2 wherein the pair of conventional transmission lines are selected from the group consisting of microstrip lines, coplanar waveguide (CPW) and substrate integrated waveguides (SIW).

10. The filter of claim 9 wherein anyone of the microstrip lines, coplanar waveguide (CPW) and substrate integrated waveguides (SIW) are formed in or on an insulating board such as a printed circuit board.

11. A method of designing or making a harmonic suppressed bandwidth and center frequency tunable capacitive coupled band pass filter comprising:
   a. selecting a prior art filter design to be converted to the harmonic suppressed bandwidth and center frequency tunable capacitive coupled band pass filter, the prior art filter design comprising a series of conventional transmission lines connected in series with capacitors,
   b. replacing one or more of the conventional transmission lines with a pair of shorter or different conventional transmission lines each having less than one-half the phase delay of the one or more of the conventional transmission lines being replaced, and
   c. inserting a lumped circuit of reactance devices between the pair of shorter or different conventional transmission lines each having less than one-half the phase delay of the conventional transmission line or lines being replaced.

12. The method of claim 11 wherein the lumped circuit has a phase delay and wherein the phase delay of the lumped circuit plus the phase delays of the pair of shorter or different conventional transmission equals the phase delay of each conventional transmission line or lines being replaced.

13. The method of claim 12 further including replacing the one or more of the conventional transmission lines with a lumped circuit of reactance devices.

14. The method of claim 11 further including replacing the one or more of the conventional transmission lines with a lumped circuit of reactance devices.

15. An improved transmission line that inhibits the transmission of harmonics compared to a conventional transmission line, the improved transmission line comprising:
   a. a pair of short conventional transmission lines, each short conventional transmission line being shorter than said conventional transmission line and each having less than one-half the phase delay of said conventional transmission line, and
   b. a lumped circuit of reactance devices installed between the pair of short conventional transmission lines, the lumped circuit having a lumped circuit phase delay and wherein the lumped circuit phase delay plus a total phase delay of the pair of short conventional transmission lines substantially equals the phase delay of said conventional transmission line.

16. The improved transmission line of claim 15 wherein each of the relatively short conventional transmission lines has substantially the same phase delay.

* * * * *